United States Patent
Lin et al.

(10) Patent No.: US 8,922,006 B2
(45) Date of Patent: Dec. 30, 2014

(54) ELONGATED BUMPS IN INTEGRATED CIRCUIT DEVICES

(75) Inventors: Yen-Liang Lin, Taichung (TW);
Chen-Shien Chen, Zhubei (TW);
Tin-Hao Kuo, Hsin-Chu (TW);
Sheng-Yu Wu, Hsin-Chu (TW);
Tsung-Shu Lin, New Taipei (TW);
Chang-Chia Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 136 days.

(21) Appl. No.: 13/559,840

(22) Filed: Jul. 27, 2012

(65) Prior Publication Data

US 2013/0256874 A1     Oct. 3, 2013

Related U.S. Application Data

(60) Provisional application No. 61/617,480, filed on Mar. 29, 2012.

(51) Int. Cl.
*H01L 23/488* (2006.01)
(52) U.S. Cl.
USPC .......................................... 257/737; 257/781
(58) Field of Classification Search
CPC .......................................................... H01L 24/08
See application file for complete search history.

(56) References Cited

U.S. PATENT DOCUMENTS

| 8,476,759 B2 * | 7/2013 | Chuang et al. ............... 257/734 |
| 2008/0308934 A1 | 12/2008 | Alvarado et al. |
| 2010/0109158 A1 | 5/2010 | Platz et al. |
| 2010/0276787 A1 | 11/2010 | Yu et al. |
| 2010/0314756 A1 * | 12/2010 | Lii et al. ....................... 257/737 |

FOREIGN PATENT DOCUMENTS

| JP | 07321247 | 12/1995 |
| JP | 2010263208 | 11/2010 |
| KR | 1020100014308 | 2/2010 |
| KR | 1020110091730 | 8/2011 |

* cited by examiner

*Primary Examiner* — Stephen W Smoot
(74) *Attorney, Agent, or Firm* — Slater & Matsil, L.L.P.

(57) ABSTRACT

A device includes a substrate, a metal pad over the substrate, and a passivation layer covering edge portions of the metal pad. The passivation layer has a first opening overlapping the metal pad, wherein the first opening has a first lateral dimension measured in a direction parallel to a major surface of the substrate. A polymer layer is over the passivation layer and covering the edge portions of the metal pad. The polymer layer has a second opening overlapping the metal pad. The second opening has a second lateral dimension measured in the direction. The first lateral dimension is greater than the second lateral dimension by more than about 7 μm. A Under-Bump metallurgy (UBM) includes a first portion in the second opening, and a second portion overlying portions of the polymer layer.

18 Claims, 3 Drawing Sheets

US 8,922,006 B2

ELONGATED BUMPS IN INTEGRATED CIRCUIT DEVICES

This application claims the benefit of the following provisionally filed U.S. patent application Ser. No. 61/617,480, filed Mar. 29, 2012, and entitled "Elongated Bumps in Integrated Circuit Devices," which application is hereby incorporated herein by reference.

BACKGROUND

Integrated circuits are made up of literally millions of active devices such as transistors and capacitors. These devices are initially isolated from each other, and are later interconnected to form functional circuits. Typical interconnect structures include lateral interconnections, such as metal lines (wirings), and vertical interconnections, such as vias and contacts.

On top of the interconnect structures, connector structures are formed, and include bond pads or metal bumps formed and exposed on the surface of the respective chip. Electrical connections are made through the bond pads/metal bumps to connect the chip to a package substrate or another die. The electrical connections may be made through wire bonding or flip-chip bonding.

One type of the connector structures includes an aluminum pad, which is electrically connected to the respective underlying interconnect structure. A passivation layer and a polymer layer are formed, with portions of the passivation layer and the polymer layer covering edge portions of the aluminum pad. An Under-Bump Metallurgy (UBM) is formed to extend into the opening in the passivation layer and the polymer layer. A copper pillar and a solder cap may be formed on the UBM.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Figure 1:
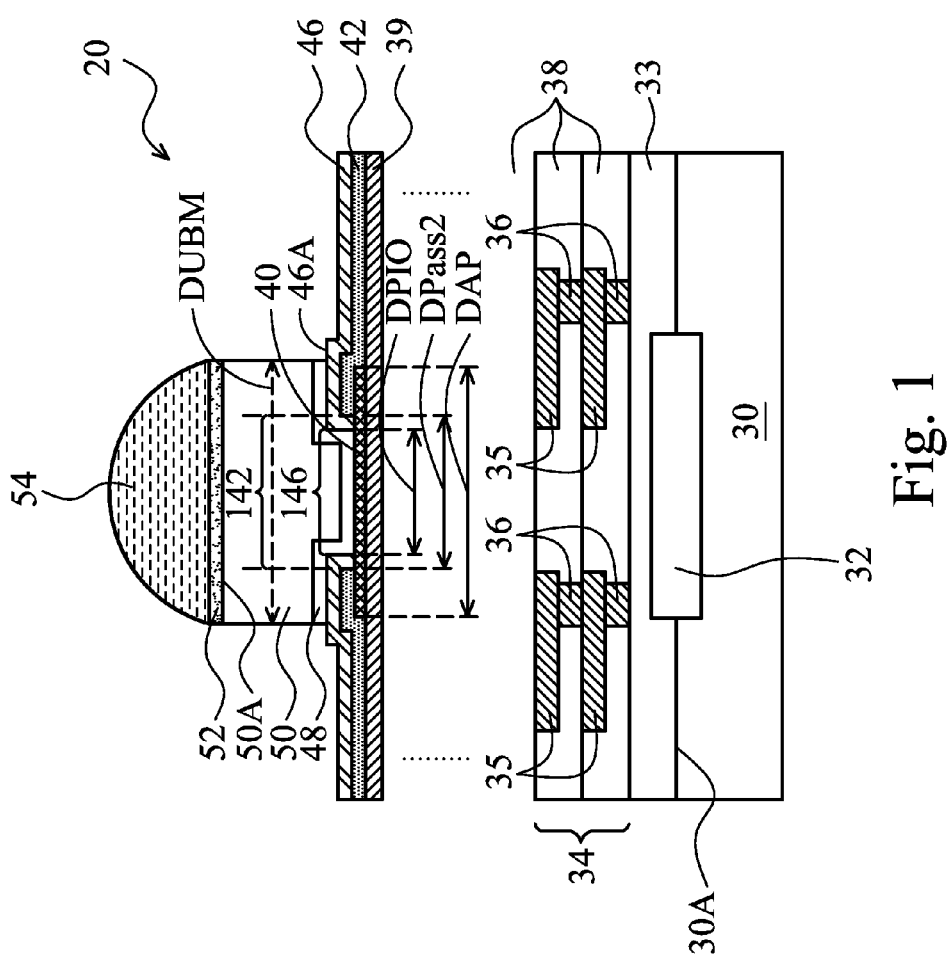
FIG. 1 illustrates a cross-sectional view of a package component in accordance with some exemplary embodiments.

FIG. 1 illustrates a cross-sectional view of package component 20 in accordance with exemplary embodiments. In some embodiments, package component 20 is a device die. Semiconductor substrate 30 in accordance with these embodiments may be a bulk silicon substrate or a silicon-on-insulator substrate. Alternatively, other semiconductor materials including group III, group IV, and group V elements may also be included in semiconductor substrate 30. Integrated circuit 32 is formed at surface 30A of semiconductor substrate 30. Integrated circuit 32 may include Complementary Metal-Oxide-Semiconductor (CMOS) devices therein. In alternative embodiments, package component 20 is an interposer die, a package substrate, a package, or the like. In the embodiments wherein package component 20 is an interposer die, package component 20 does not include active devices such as transistors therein. Package component 20 may include passive devices such as resistors and capacitors, or free from passive devices in these embodiments.

Package component 20 may further include Inter-Layer Dielectric (ILD) 33 over semiconductor substrate 30, and metal layers 34 over ILD 33. Metal layers 34 include metal lines 35 and vias 36 formed in dielectric layers 38. In some embodiments, dielectric layers 38 are formed of low-k dielectric materials. The dielectric constants (k values) of the low-k dielectric materials may be less than about 2.8, or less than about 2.5, for example. Metal lines 35 and vias 36 may be formed of copper, a copper alloy, or other metals.

Metal pad 40 is formed over metal layers 34, and may by electrically coupled to circuit 32 through metal lines 35 and vias 36 in metal layers 34. Metal pad 40 may be an aluminum pad or an aluminum-copper pad. The lateral dimension of metal pad 40 is marked as DAP. Lateral dimension DAP may be a length or a width that is measured in the direction parallel to the major surfaces (such as top surface 30A) of substrate 30.

Passivation layer 42 is formed to cover the edge portions of metal pad 40. The central portion of metal pad 40 is exposed through (and under) opening 142 in passivation layer 42. Opening 142 has lateral dimension Dpass2, which may be either a length or a width that is measured in the direction parallel to major surface 30A of substrate 30. Passivation layer 42 may be a single layer or a composite layer, and may be formed of a non-porous material. In some embodiments, passivation layer 42 is a composite layer comprising a silicon oxide layer (not shown), and a silicon nitride layer (not shown) over the silicon oxide layer. In alternative embodiments, passivation layer 42 comprises Un-doped Silicate Glass (USG), silicon oxynitride, and/or the like. Although one passivation layer 42 is shown, there may be more than one passivation layer. For example, under metal pad 40, there may be passivation layer 39. In which embodiments, passivation layer 39 and passivation layer 42 are also referred to as passivation-1 (or pass1) 39 and passivation-2 (or pass2) 42 throughout the description.

Polymer layer 46 is formed over passivation layer 42 and covers passivation layer 42. Polymer layer 46 may comprise a polymer such as an epoxy, polyimide, benzocyclobutene (BCB), polybenzoxazole (PBO), and the like. Polymer layer 46 is patterned to form opening 146, through which metal pad 40 is exposed. Opening 146 has lateral dimension DPIO, which is measured in the direction parallel to major surface 30A of substrate 30.

Under-Bump Metallurgy (UBM) 48 is formed over metal pad 40. UBM 48 comprises a first portion over polymer layer 46, and a second portion extending into opening 146 to contact metal pad 40. The lateral dimension of UBM 48 is marked as DUBM, which is measured in the direction parallel to major surface 30A of substrate 30. In some embodiments, UBM 48 includes a titanium layer and a seed layer that is formed of copper or a copper alloy.

Metal pillar 50 is formed over UBM 48, and is co-terminus with UBM 48. For example, each of the edges of metal pillar 50 is aligned to a corresponding edge of UBM 48. Accordingly, the lateral dimensions of metal pillar 50 are also equal to the respective lateral dimensions of UBM 48. UBM 48 may be in physical contact with metal pad 40 and metal pillar 50. In some exemplary embodiments, metal pillar 50 is formed of a non-reflowable metal(s) that does not melt in reflow processes. For example, metal pillar 50 may be formed of copper or a copper alloy. The top surface 50A of metal pillar 50 is higher than top surface 46A of polymer layer 46.

In addition to metal pillar 50, there may be additional metal layers such as metal layer 52 formed on metal pillar 50, wherein metal layer 52 may include a nickel layer, a palladium layer, a gold layer, or multi-layers thereof. Solder cap 54 may also be formed on metal layer 52, wherein solder cap 54 may be formed of a Sn—Ag alloy, a Sn—Cu alloy, a Sn—Ag—Cu alloy, or the like, and may be lead-free or lead-containing.

In accordance with some embodiments, to minimize the stress in low-k dielectric layers 38 and the stresses applied on pass2 42 and polymer layer 46, lateral dimension DUBM of UBM 48, lateral dimension Dpass2 of opening 142 in pass2 42, and lateral dimension DPIO of opening 146 in polymer layer 46 may have the following relationship:

$$(DPIO+7\ \mu m) < Dpass2 < (DUBM-2\ \mu m) \quad [Eq.\ 1]$$

When this relationship is satisfied, the stresses in low-k dielectric layers 38, pass2 42, and polymer layer 46 are low enough, so that package component 20 may pass reliability tests.

Figure 2:
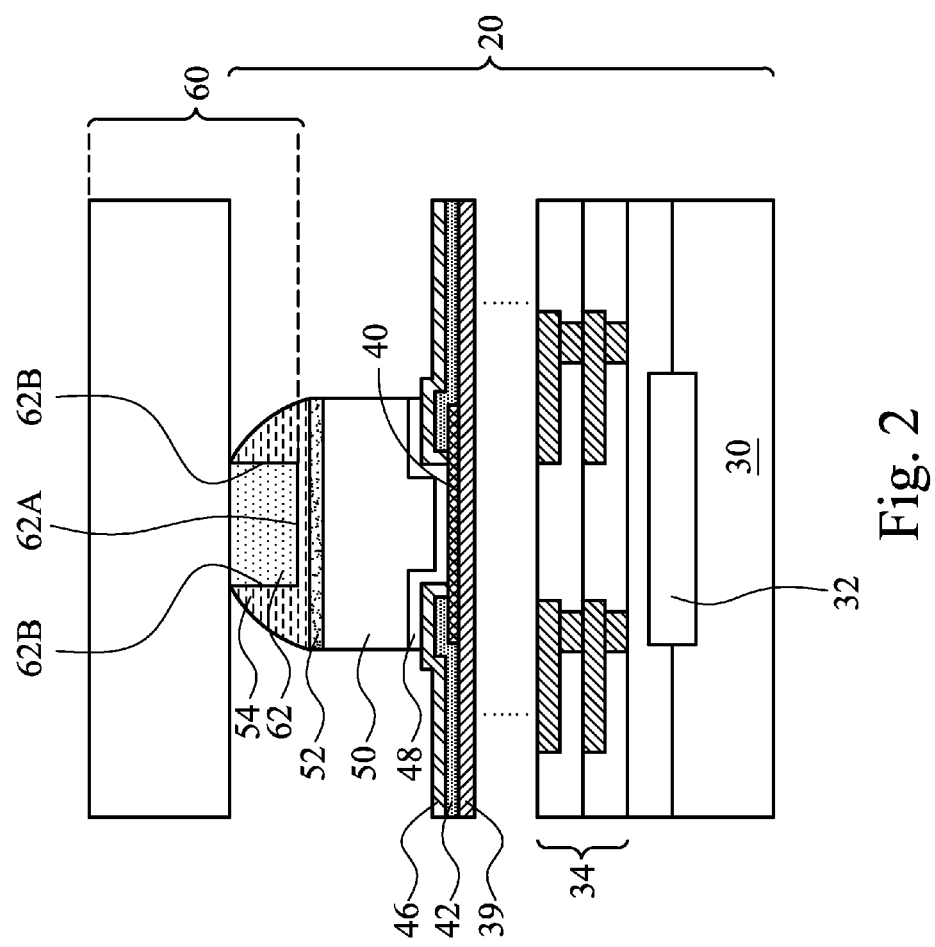
FIG. 2 illustrates a package including a bump-on-trace bond between two package components.

FIG. 2 illustrates the bonding of metal pillar 50 to metal trace 62 of package component 60 through a Bump-On-Trace (BOT) bonding scheme. In some embodiments, package component 60 is a package substrate, which may be a laminate substrate. Package component 60 includes a plurality of laminated dielectric layers, and metal lines and vias (not shown) embedded in the laminated dielectric layers. In alternative embodiments, package component 60 is a device die, a package, an interposer die, or the like. In the BOT bonding scheme, solder region 54 is bonded to surface 62A and sidewalls surfaces 62B of metal trace 62.

Figure 3:
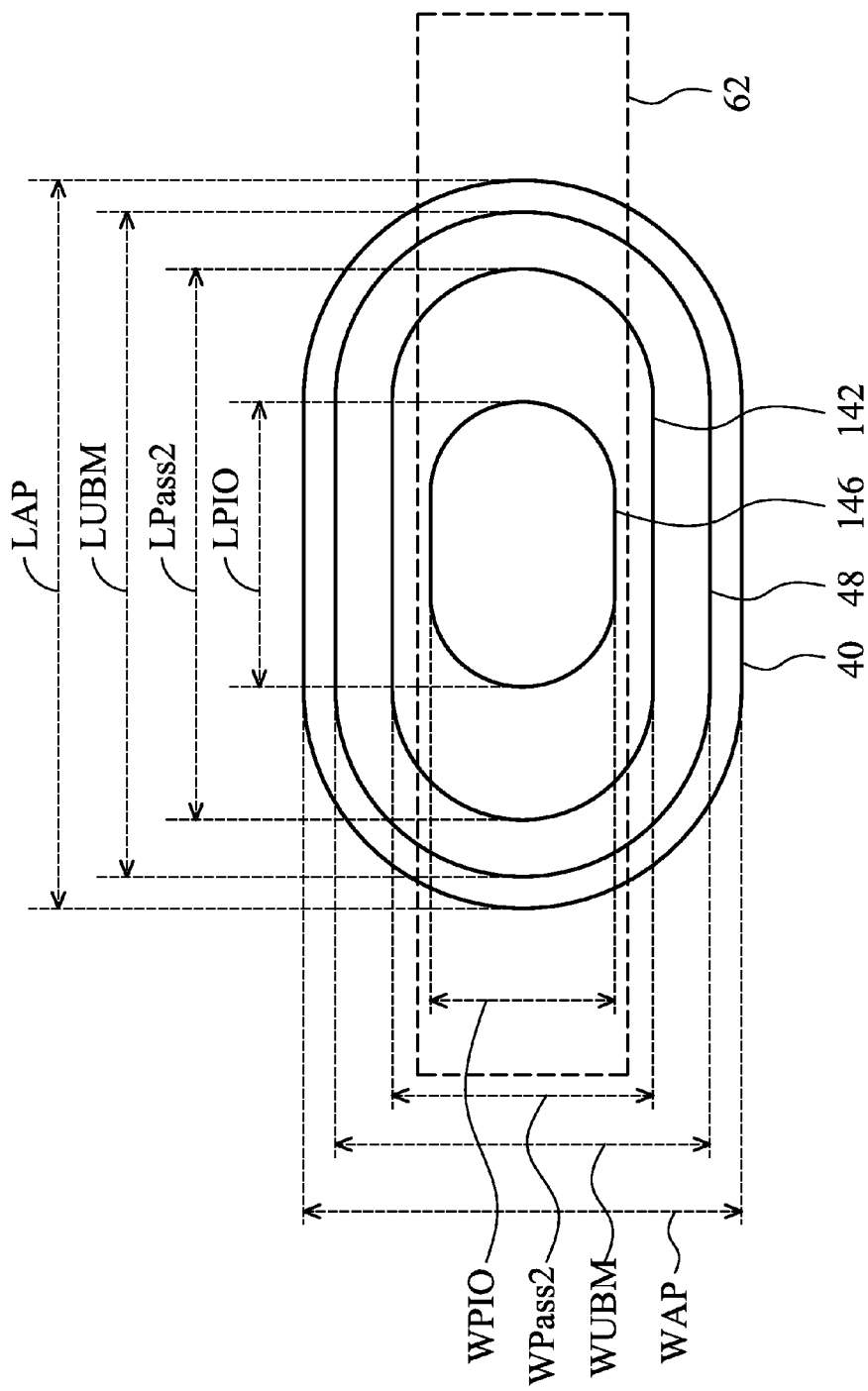
FIG. 3 illustrates the top view of various components in FIG. 1.

FIG. 3 illustrates exemplary top views of metal pad 40, UBM 48, pass2 opening 142, and polymer opening 146. Metal trace 62 of package component 60 (FIG. 2) is also schematically illustrated. In some embodiments, metal pad 40, UBM 48, pass2 opening 142, and polymer opening 146 have elongated top view shapes, and have lengths measured in the respective lengthwise directions, and widths measured in the respective widthwise directions. The lengthwise direction of metal trace 62 is parallel the lengthwise direction of metal pad 40, UBM 48, pass2 opening 142, and polymer opening 146. The lateral dimensions DUBM, Dpass2, and DPIO of UBM 48, pass2 opening 142, and polymer opening 146 as in Equation 1 may be lengths LUBM, Lpass2, and LPIO, respectively. Equation 1 thus may be rewritten as:

$$(LPIO+7\ \mu m) < Lpass2 < (LUBM-2\ \mu m) \quad [Eq.\ 2]$$

Furthermore, the lateral dimensions DUBM, Dpass2, and DPIO of UBM 48, pass2 opening 142, and polymer opening 146 may also be widths WUBM, Wpass2, and WPIO, respectively. Equation 1 thus may also be rewritten as:

$$(WPIO+7\ \mu m) < Wpass2 < (WUBM-2\ \mu m) \quad [Eq.\ 3]$$

When forming package component 20 as in FIGS. 1 and 3, either Equation 2 or 3 is satisfied in accordance with some embodiments. Furthermore, both Equations 2 and 3 may be satisfied at the same time.

Equations 2 and 3 do not include the relationship between length LAP and width WAP of metal pad 40. Experiment results have indicated that the shape and the sizes of metal pad 40 have insignificant effects on the reduction of the stress in the structure shown in FIG. 1. Accordingly, there is flexibility in the selection of the sizes and the shape of metal pad 40 without sacrificing the reliability of package component 20.

Simulations have been performed on different sample dies 20 (FIG. 1) that has different dimensions LAP/WAP, LUBM/WUBM, Lpass2/Wpass2, and LPIO/WPIO. A portion of the simulation results is listed in Table 1.

TABLE 1

| | Sample Dies | | | | | | | |
|---|---|---|---|---|---|---|---|---|
| | 1 | 2 | 3 | 4 | 5 | 6 | 7 | 8 |
| LAP/WAP | 79 | 56/101 | 79 | 79 | 79 | 56/101 | 79 | 79 |
| Lpass2/Wpass2 | 69 | 69 | 69/74 | 50/74 | 48/74 | 44/74 | 42/74 | 37/74 |
| LPIO/WPIO | 30/40 | 30/40 | 30/40 | 30/40 | 30/40 | 30/40 | 30/40 | 30/40 |
| LUBM/WUBM | 50/95 | 50/95 | 50/95 | 50/95 | 50/95 | 50/95 | 50/95 | 50/95 |
| Normalized Stress | 1.19 | 1.19 | 1.20 | 1.1 | 1.03 | 1.00 | 0.98 | 0.97 |

In Table 1, eight sample dies that have the structure in FIG. 1 are simulated to reveal the corresponding stresses in the respective low-k dielectric layer 38. The resulting stresses as shown in the last table row are shown as relative values, which are normalized to the stress in the low-k dielectric layer 38 in sample die 6. Sample die 6, besides being simulated, is also formed on a physical silicon substrate. The results indicated that the structure of sample die 6 can pass reliability tests with adequate margin. With some margins taken into account, samples 4, 5, 6, 7, and 8, which have normalized stresses 1.1, 1.03, 1.00, 0.98, and 0.97, respectively, are acceptable samples that pass the simulations, and sample dies 1, 2, and 3, which have normalized stresses 1.19, 1.19, and 1.20, respectively, are failed samples. Furthermore, sample die 1 is also formed on a physical silicon substrate, and the results indicated that it does fail due to the low-k delamination in the respective low-k dielectric layer 38.

The second, the third, the fourth, and the fifth rows are the lateral dimensions (lengths and width, please refer to FIG. 3). Each table cell in the second through the fifth rows in Table 1 includes either one value, or two values separated by a "/" sign. The value before the "/" sign is the length (in μm), and the value after the "/" sign is the width (in μm). If a table cell has one value, then the value represents both the length and the width, which are equal to each other. Comparing the LAP/WAP values of sample dies 1 and 2, it is found that changing the shape of metal pad 40 (FIG. 1) from the round shape with the diameter being 79 μm to the elongated shape with LAP/WAP being 56/101 does not result in the reduction of stress, wherein the stresses of both sample dies 1 and 2 are 1.19. This indicates that the size and the shape of metal pad 40 do not affect the stress. The comparison of Lpass2/Wpass2 values of sample dies 2 and 3 also reveal that the shape of pass2 opening 142 has insignificant effect on the reduction of the stress.

The Lpass2 and LUBM values of sample die 2 are 69 μm and 50 μm, respectively. The Lpass2 and LUBM values of sample die 3 are 50 μm and 50 μm, respectively. It is found that reducing the difference between Lpass2 and LUBM values does result in the stress to reduce from 1.20 of sample die 3 to 1.1 of sample die 4. As shown in sample dies 5 through 8, when the relationship Lpass2<=(LUBM−2 μm) is satisfied, the respective stresses are low, and fall into the acceptable range. Further comparing the Lpass2 and LPIO values of sample dies 3 through 8, it is found that the acceptable low stresses may be obtained when the relationship (LPIO+7 μm)<Lpass2 is satisfied.

Table 1 reveals the relationship between lengths LAP/Lpass2/LUBM/LPIO and the respective stresses. Widths WAP/Wpass2/WUBM/WPIO and the respective stresses also have similar relationships (please refer to Equation 3). For example, Table 2 illustrates the simulation results, wherein the lengths LAP/Lpass2/LUBM/LPIO remain constant, while the widths WAP/Wpass2/WUBM/WPIO of sample dies are changed. The stresses also change with the change of widths WAP/Wpass2/WUBM/WPIO.

TABLE 2

| | Sample Dies | | | | | | |
|---|---|---|---|---|---|---|---|
| | 1 | 2 | 3 | 4 | 5 | 6 | 7 |
| LAP/WAP | 79 | 79 | 79 | 79 | 79 | 79 | 79 |
| Lpass2/Wpass2 | 45/105 | 45/95 | 45/93 | 45/60 | 45/50 | 45/47 | 45/44 |
| LPIO/WPIO | 30/40 | 30/40 | 30/40 | 30/40 | 30/40 | 30/40 | 30/40 |
| LUBM/WUBM | 50/95 | 50/95 | 50/95 | 50/95 | 50/95 | 50/95 | 50/95 |
| Normalized Stress | 1.22 | 1.15 | 1.02 | 1.00 | 0.98 | 0.97 | 0.96 |

The simulation results shown in Table 2 indicate that when Equation 3 is satisfied, the stresses are low. For example, sample dies 1 and 2 do not satisfy the relationship Wpass2<(WUBM−2 μm), and the corresponding stresses of sample dies 1 and 2 are high. Sample dies 4-7 satisfy the relationship Wpass2<(WUBM−2 μm), and the corresponding stresses of sample dies 4-7 are low. Sample 3 is on the margin, and its stress is a transitional stress from high stresses to low stresses.

In the embodiments, by optimizing the sizes of the bump structures, the stresses in low-k dielectric layers, the passivation layer, and the polymer layer may be reduced. The improvement does not require additional lithography steps and additional production cost. Furthermore, since there is no requirement to the shape and the size of metal pad 40, the routing flexibility of metal pad 40 is not adversely affected.

In accordance with embodiments, a device includes a substrate, a metal pad over the substrate, and a passivation layer covering edge portions of the metal pad. The passivation layer has a first opening overlapping the metal pad, wherein the first opening has a first lateral dimension measured in a direction parallel to a major surface of the substrate. A polymer layer is over the passivation layer and covering the edge portions of the metal pad. The polymer layer has a second opening overlapping the metal pad. The second opening has a second lateral dimension measured in the direction. The first lateral dimension is greater than the second lateral dimension by more than about 7 μm. An UBM includes a first portion in the second opening, and a second portion overlying portions of the polymer layer.

In accordance with other embodiments, a device includes a substrate, a metal pad over the substrate, and a passivation layer covering edge portions of the metal pad. The passivation layer includes a first opening overlapping the metal pad. The first opening has a first lateral dimension measured in a direction parallel to a major surface of the substrate. A polymer layer is over the passivation layer and covering the edge portions of the metal pad. The polymer layer includes a second opening overlapping the metal pad. An UBM includes a first portion in the second opening, and a second portion overlying portions of the polymer layer. The UBM has a second lateral dimension measure in the direction. The first lateral dimension is smaller than the second lateral dimension by more than about 2 μm.

In accordance with yet other embodiments, a device includes a substrate, a metal pad over the substrate, and a passivation layer covering edge portions of the metal pad. The passivation layer has a first opening over the metal pad. The first opening has a first length and a first width measured in a first direction and a second direction, with the first and the second directions parallel to a major surface of the substrate. A polymer layer is over the passivation layer and covering the passivation layer, wherein the polymer layer has a second opening, with the portion of the metal pad being disposed underlying the second opening. The second opening has a second length and a second width measured in the first direction and the second direction, respectively. The first length is greater than the second length by more than about 7 μm, and the first width is greater than the second width by more than about 7 μm. An UBM includes a first portion in the second opening and a second portion over a portion of the polymer layer. The UBM has a third length and a third width measured in the first direction and the second direction, respectively. The first length is smaller than the third length by more than about 2 μm, and the first width is smaller than the third width by more than about 2 μm.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a substrate;
   a metal pad over the substrate;
   a passivation layer covering edge portions of the metal pad, wherein the passivation layer comprises a first opening overlapping the metal pad, and wherein the first opening has a first lateral dimension measured in a direction parallel to a major surface of the substrate;
   a polymer layer over the passivation layer and covering the edge portions of the metal pad, wherein the polymer layer comprises a second opening overlapping the metal pad, wherein the second opening has a second lateral dimension measured in the direction, and wherein the first lateral dimension is greater than the second lateral dimension by more than about 7 μm;
   a Under-Bump metallurgy (UBM) comprising a first portion in the second opening, and a second portion overlying portions of the polymer layer; and
   a metal pillar over the UBM, wherein the metal pillar is formed of a non-solder metallic material, and wherein the metal pillar comprises vertical edges substantially perpendicular to a top surface of the metal pad.

2. The device of claim 1, wherein the UBM has a third lateral dimension measured in the direction, and wherein the first lateral dimension is smaller than the third lateral dimension by more than about 2 µm.

3. The device of claim 1 further comprising a solder region over the metal pillar, with the solder region comprising a rounded top surface.

4. The device of claim 3, wherein the metal pad, the passivation layer, the polymer layer, and the UBM are comprised in a device die, and wherein the metal pillar is bonded to a metal trace of a package substrate through a bump-on-trace bond, wherein the solder region bonding the metal pillar to the metal trace is in contact with opposite sidewalls of the metal trace.

5. The device of claim 1, wherein the UBM has an elongated top-view shape and comprises a length and a width smaller than the length, and wherein the direction is parallel to a lengthwise direction of the UBM.

6. The device of claim 1, wherein the UBM has an elongated top-view shape and comprises a length and a width smaller than the length, and wherein the direction is parallel to a widthwise direction of the UBM.

7. The device of claim 1, wherein the first opening, the second opening, and the UBM have elongated top-view shapes.

8. A device comprising:
a substrate;
a metal pad over the substrate;
a passivation layer covering edge portions of the metal pad, wherein the passivation layer comprises a first opening overlapping the metal pad, and wherein the first opening has a first lateral dimension measured in a direction parallel to a major surface of the substrate;
a polymer layer over the passivation layer and covering the edge portions of the metal pad, wherein the polymer layer comprises a second opening overlapping the metal pad;
a Under-Bump metallurgy (UBM) comprising a first portion in the second opening, and a second portion overlying portions of the polymer layer, wherein the UBM has a second lateral dimension measured in the direction, and wherein the first lateral dimension is smaller than the second lateral dimension by more than about 2 µm; and
a metal pillar over the UBM, wherein edges of the metal pillar are aligned to respective edges of the UBM, and wherein the metal pillar is formed of a non-solder metallic material.

9. The device of claim 8, wherein the second opening has a third lateral dimension measured in the direction, and wherein the first lateral dimension is greater than the third lateral dimension by more than about 7 µm.

10. The device of claim 8, wherein the metal pad, the passivation layer, the polymer layer, and the UBM are comprised in a device die, and wherein the metal pillar is bonded to a metal trace of a package substrate through a bump-on-trace bonding, wherein a solder region bonding the metal pillar to the metal trace is in contact with opposite sidewalls of the metal trace.

11. The device of claim 8, wherein the UBM has an elongated top-view shape with a length and a width smaller than the length, and wherein the direction is parallel to a lengthwise direction of the UBM.

12. The device of claim 8, wherein the UBM has an elongated top-view shape with a length and a width smaller than the length, and wherein the direction is parallel to a widthwise direction of the UBM.

13. The device of claim 8, wherein the first opening, the second opening, and the UBM have elongated top-view shapes.

14. A device comprising:
a substrate;
a metal pad over the substrate;
a passivation layer covering edge portions of the metal pad, wherein the passivation layer comprises a first opening, with a portion of the metal pad being disposed underlying the first opening, and wherein the first opening has a first length and a first width measured in a first direction and a second direction, with the first and the second directions parallel to a major surface of the substrate;
a polymer layer over the passivation layer and covering the passivation layer, wherein the polymer layer comprises a second opening, with the portion of the metal pad being disposed underlying the second opening, wherein the second opening has a second length and a second width measured in the first direction and the second direction, respectively, and wherein the first length is greater than the second length by more than about 7 µm, and the first width is greater than the second width by more than about 7 µm;
a Under-Bump metallurgy (UBM) comprising a first portion in the second opening, and a second portion over a portion of the polymer layer, wherein the UBM has a third length and a third width measured in the first direction and the second direction, respectively, and wherein the first length is smaller than the third length by more than about 2 µm, and the first width is smaller than the third width by more than about 2 µm; and
a metal pillar over the UBM, wherein edges of the metal pillar are aligned to respective edges of the UBM, and wherein the metal pillar is formed of a non-solder metallic material.

15. The device of claim 14, wherein the first, the second, and the third lengths are greater than the first, the second, and the third widths, respectively.

16. The device of claim 14 further comprises a low-k dielectric layer underlying the metal pad.

17. The device of claim 14, wherein the UBM comprises copper.

18. The device of claim 14, wherein the metal pad, the passivation layer, the polymer layer, and the UBM are comprised in a device die, and wherein the metal pillar is bonded to a metal trace of a package substrate through a bump-on-trace bond, wherein a solder region bonding the metal pillar to the metal trace is in contact with opposite sidewalls of the metal trace.

* * * * *